(12) United States Patent
Nakano et al.

(10) Patent No.: US 6,251,743 B1
(45) Date of Patent: *Jun. 26, 2001

(54) METHOD OF LIQUID TREATMENT OF MICROSTRUCTURES COMPRISING BENDABLE STRUCTURAL MEMBERS

(75) Inventors: Motoo Nakano; Hiroshi Nomura; Masaya Katayama; Toshimi Ikeda; Fumihiko Inoue; Junichi Ishikawa, all of Kawasaki; Masahiro Kuwamura, Kasugai, all of (JP)

(73) Assignees: Fujitsu Limited, Kawasaki; Fujitsu VLSI Limited, Kasugai, both of (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/071,991

(22) Filed: May 5, 1998

Related U.S. Application Data (60) Continuation of application No. 08/820,359, filed on Mar. 12, 1997, now Pat. No. 5,888,633, which is a division of application No. 08/083,371, filed on Jun. 29, 1993, now Pat. No. 5,652,167.

(30) Foreign Application Priority Data

Jun. 30, 1992 (JP) .................................................. 4-173053
Aug. 31, 1992 (JP) .................................................. 4-232443

(51) Int. Cl.[7] .................................................. H01L 21/20
(52) U.S. Cl. .................................. 438/397; 438/239; 438/216; 438/6
(58) Field of Search .................................. 438/238, 239, 438/250, 255, 387, 381, 393, 348, 52, 53, 48, 397

(56) References Cited

U.S. PATENT DOCUMENTS

| | | |
|---|---|---|
| 4,613,518 | 9/1986 | Ham et al. . |
| 5,084,324 | 1/1992 | Shirmer . |
| 5,340,763 | 8/1994 | Dennison . |
| 5,342,800 | 8/1994 | Jun . |
| 5,652,167 | 7/1997 | Nakano et al. . |
| 5,888,633 | 3/1999 | Nakano et al. . |

OTHER PUBLICATIONS

Stemme, Goran, "Resonant Silicon Sensors", J. Micromech. Microeng, vol. 1(1991), pp. 113–125.

S. Wolf, "Silicon Processing for the VLSI Era", Lattice Press, vol. 2, (1991), pp. 214–215.

*Primary Examiner*—Savitri Mulpuri
(74) *Attorney, Agent, or Firm*—Staas & Halsey LLP

(57) ABSTRACT

Microstructures, including a plurality of spaced structural members which are bendable under an external force, undergo a treating method using a first treating liquid, to prevent permanent deformation, by removing the microstructure from the first treating liquid to an environment having a pressure less than atmospheric pressure; or moving the microstructure from the first treating liquid to a second treating liquid having a smaller surface tension than the first treating liquid, and then removing the microstructure from the second liquid; or drying the microstructure removed from the first treating liquid by exposing same to a liquid vapor having a smaller surface tension than the first treating liquid; or removing the microstructure from the first treating liquid to the atmosphere, and drying the microstructure using an energy beam of high intensity or an ultrasonic wave.

30 Claims, 7 Drawing Sheets

TO VACUUM PUMP

TO DRAINAGE PUMP

METHOD OF LIQUID TREATMENT OF MICROSTRUCTURES COMPRISING BENDABLE STRUCTURAL MEMBERS

This is a continuation of application Ser. No. 08/820,359, filed Mar. 12, 1997 now U.S. Pat. No. 5,888,633, which is a division of application Ser. No. 08/083,371, filed Jun. 29, 1993, now U.S. Pat. No. 5,652,167.

BACKGROUND OF THE INVENTION

1. Field of the Invention

The invention relates to micro-structures which are typically found in semiconductor devices and other minute devices such as resonant sensors or micromachines. More particularly, the invention relates to a method of liquid treatment of micro-structures comprising structural members liable to be bent during the process of the liquid treatment, and to micro-structures having structural members able to withstand a permanent bend through the liquid treatment thereof. By way of example, such a micro-structure is often found in a capacitor of a semiconductor device called a DRAM, in which the micro-structure is made up of structural members in the form of, e.g., thin sheet, one end of which is fixed and the other end is free.

2. Description of Related Art

In capacitors of DRAM semiconductor devices referred to above, since the capacitors are required to have a certain capacity in very small, limited regions, a means to secure the required capacitor areas is found by incorporating a three-dimensional construction such as a finned structure. Other minute devices, which are exemplified by resonant sensors and micromachines and are made by applying utilizing processes used in the production of fine semiconductor devices, may employ micro-structures having members liable to be bent, such as fine beams or sheets, supported at one end or both ends thereof.

Figure 1:
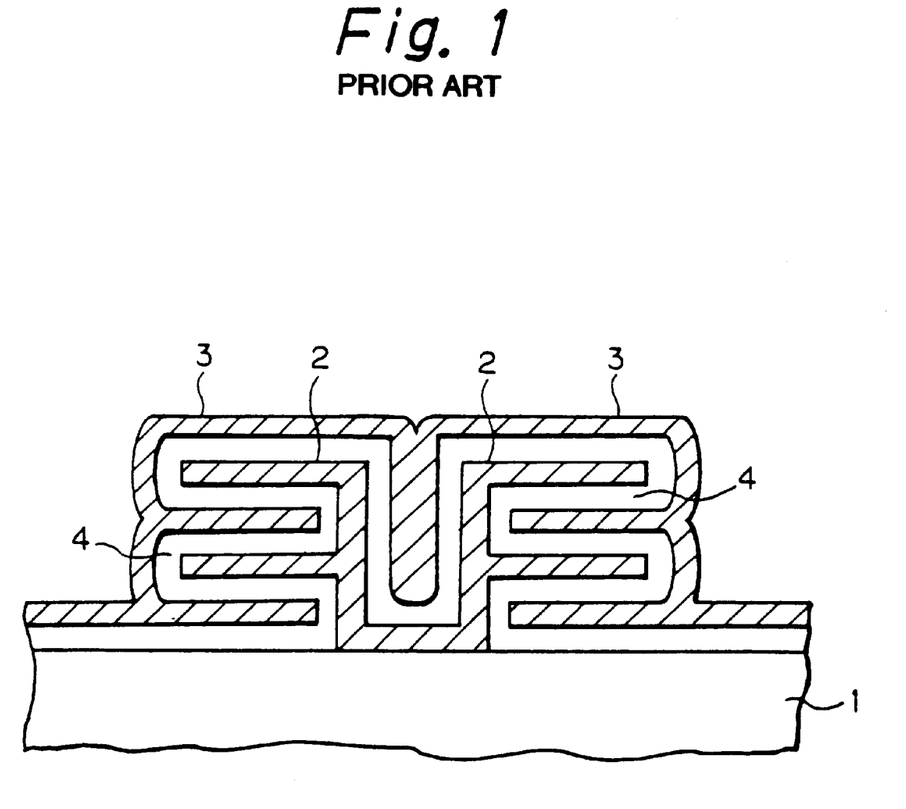
FIG. 1 schematically shows an illustration of a capacitor having a fin-like structure in a DRAM device.
Figure 2A:
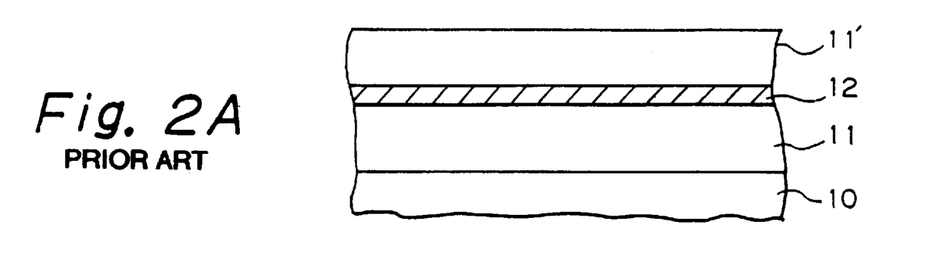
FIGS. 2A to 2D illustrate the process for the production of the capacitor shown in FIG. 1.
Figure 2B:
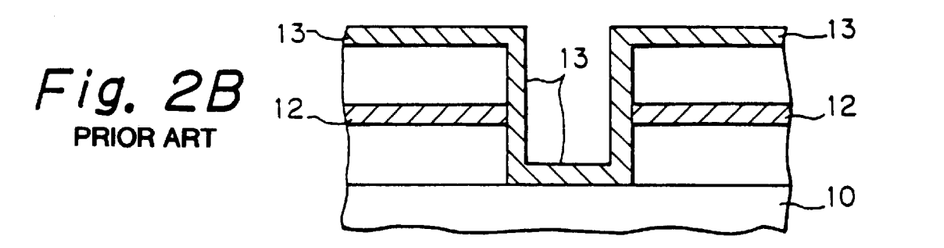
Figure 2C:
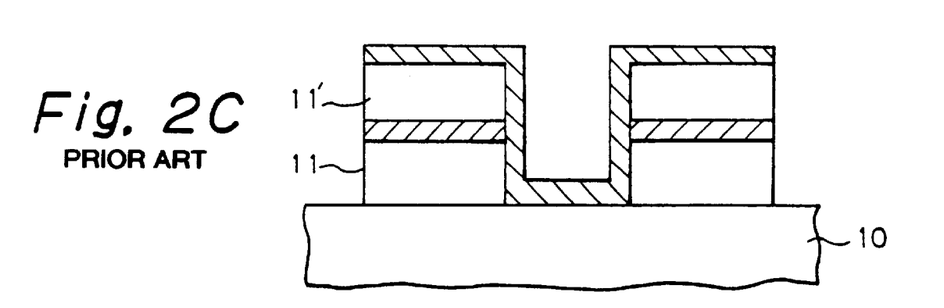
Figure 2D:
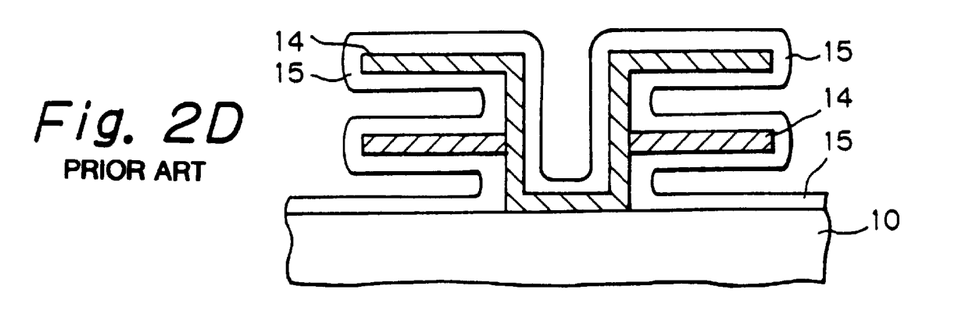

By way of example, a three-dimensional capacitor of a DRAM semiconductor device is illustrated in FIG. 1. In this drawing, 1 represents a semiconductor substrate, 2 and 3 are capacitor electrodes, and 4 is an insulating film. This capacitor is produced by the following procedure:

First, as shown in FIG. 2A, a first insulator film 11, a conductor film 12 for forming a horizontal electrode of the capacitor, and a second insulator film 11' are sequentially laminated on a semiconductor substrate 10. The insulator films 11 and 11' are formed by, e.g., chemical vapor deposition (CVD) of $SiO_2$, and the conductor film 12 is made by, e.g., CVD of polysilicon. Subsequently, holes are made in the laminated films so as to expose the surface of the substrate 10 at the bottoms of the holes, and a film of conductor 13 (polysilicon in this explanation) is then deposited, as shown in FIG. 2B. Inside the holes, the deposited polysilicon is connected to the former polysilicon film 12, and will form a support for supporting a horizontal electrode later formed from the film 12. The laminated films are then etched so as to leave separate, respective portions around the holes on the substrate, to thereby provide separate capacitor portions, as shown in FIG. 2C. Thereafter, the remaining insulator films 11 and 11' are etched and removed, while micro-structures 14 are left which form one of the capacitor electrodes, one end of which is fixed at the central support and the other is free. A thin film of silicon nitride is then formed by CVD to provide an insulator film 15 for the capacitor, as shown in FIG. 2D. Finally, a polysilicon film is formed to provide opposite electrodes, to thereby complete a capacitor of three-dimensional structure as shown in FIG. 1.

During the sequential manufacturing processes described above, liquids, such as an enchant solution and water, are used for the etching of the insulator films 11 and 11' and the pretreatment (i.e., washing) for the subsequent formation of silicon nitride film 15. Conventionally, in these treatments using liquids, the substrate bearing materials for the production of the capacitor are immersed in the liquid, and then removed therefrom at atmospheric pressure. To the inventors' knowledge, it is not known in the art to use an environment of a pressure less than atmospheric pressure to which a substrate is removed from a treating liquid, as in the present invention.

Figure 3:
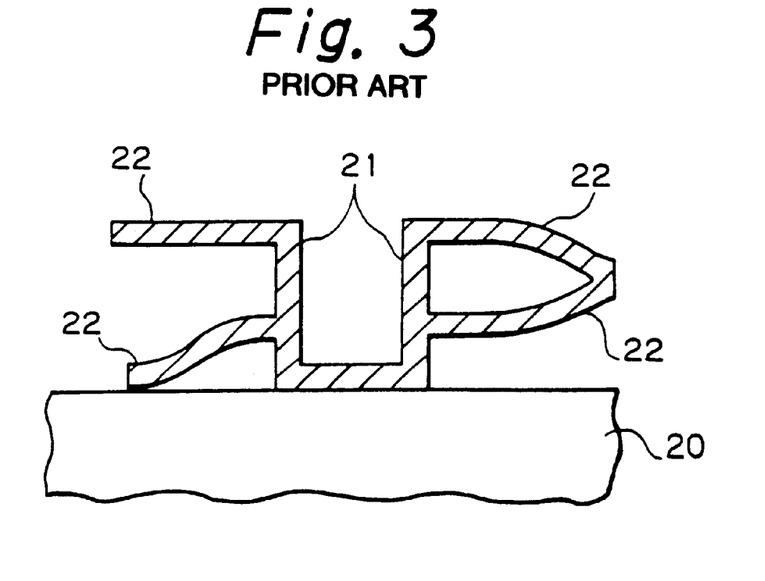
FIG. 3 schematically shows structural members permanently deformed by the bend thereof.

When the micro-structure of one of the electrodes for a capacitor as indicated by 14 in FIG. 2D is investigated after the etching of the laminated films for the formation of the separate capacitor portions (FIG. 2C), followed by the removal of the insulator film, a phenomenon may be observed in which the free end of a fin-like electrode 22 projecting from the support 21 is bent, and is in contact with the free end of another electrode 22 or the substrate 20, as shown in FIG. 3. The phenomenon will become more common as finer capacitors are made and the space between the fins and the thickness of the fins are accordingly reduced. In most cases, such a fin-like member brought into contact with another member or the substrate, will not be separated from the opposite member or substrate, that is, such a member will remain deformed. The bend and contact of the fin-like member with another member or substrate leads to the a decrease in the capacitor area, and should therefore be eliminated.

Also, in resonant sensors such as those described in Goran Stemme, J. Micromech. Microeng., 1(1991) 113–125, a micro-structure having a beam-, bridge-, or diaphragm-like member of thin, flexural material is employed. Such a micro-structure, in a resonant sensor, is made by applying the production techniques used in the manufacture of semiconductor devices, such as photolithography and etching. Thus, the flexural members may suffer from permanent deformation through the bend and contact thereof with another component of the sensor during the production process of the member, which leads to a failure of the intended sensor, as in the production of capacitors of semiconductor devices described above.

Furthermore, similar micro-structures having a beam-, bridge-, or diaphragm-like member may also be used in various devices called micromachines, and can cause the same problem as in the above-mentioned micro-structures of DRAM semiconductor devices and resonant sensors.

SUMMARY OF THE INVENTION

It is an object of the invention to provide a method of liquid treatment of micro-structures comprising at least a structural member liable to be bent, which can prevent the permanent deformation of the member through the treatment.

It is another object of the invention to provide a micro-structure comprising at least a member supported at one end thereof and liable to be bent, which is capable of avoiding permanent deformation of the member resulting from a liquid treatment.

According to an aspect of the invention, there is provided a method of liquid treatment of a micro-structure comprising at least a structural member liable to be bent, the member being formed so as to leave a space between the same and another member liable to be bent and/or other such rigid component, the method comprising placing the micro-structure in a treating liquid and subsequently removing the micro-structure therefrom, wherein the micro-structure is removed from the liquid to an environment having a pressure less than atmospheric pressure.

In a variation of the method of the invention, the micro-structure in the treating liquid is then displaced therefrom to another treating liquid having a smaller surface tension than that of the former treating liquid, and is subsequently removed from the latter treating liquid. In other words, the micro-structure is placed in a first treating liquid and then in a second treating liquid having a smaller surface tension than that of the first liquid, and subsequently removed from the second liquid.

Alternatively, the method of the present invention may comprise drying the micro-structure removed from the treating liquid by exposing the micro-structure to vapor of a liquid having a smaller surface tension than that of the treating liquid.

According to another aspect of the invention, the micro-structure is removed from the treating liquid to the atmosphere, and is then dried using laser light, infrared radiation, an electron beam, microwaves, or ultrasonic waves.

As is used herein, the term "micro-structure" refers to a structure or construction comprising a member or members having e.g., minute dimensions of, e.g., the order of micron or submicron, which is made using processes for creating very small structures, such as those employed in the production of semiconductor devices. Thus, a substrate made of, e.g., silicon, is generally used for the formation of a number of micro-structures thereon. The micro-structures made on a substrate may be treated together according to the inventive method, by immersing the substrate, on which the micro-structures have been formed, in the treating liquid.

The term "liquid treatment" refers to any treatment in which micro-structures, comprising at least a member liable to be bent under an external force, are treated using a liquid. Thus, the treatment includes immersion of micro-structures in a treating liquid in a container, placement of micro-structures in a flowing liquid, and the like. The treatment involves the subsequent removal of the micro-structures from the liquid so used.

According to a further aspect of the invention, there is provided a micro-structure comprising at least a member supported at only one end thereof and formed so as to leave a space between the same and another member also supported at one end thereof and/or a rigid component, wherein the member has a length L from the supported end to the other end and as specified by the following equation:

(a) for the member adjacent to only the rigid component:

$$L<(2Edt^3/3P)^{1/4}$$

wherein E is a Young's modulus of the material of the member;

d is a distance between the member and the component;

t is a thickness of the member; and

P is an external pressure applied to the member; or (b) for the member adjacent to the another member liable to be bent:

$$L<(Ed't^3/3P)^{1/4}$$

wherein E, t and P are as defined above; and d', is a distance between the members.

The foregoing and other objects as well as the characteristic features of the invention will be more apparent and easily understood from the following description and the appended claims when read in conjunction with the accompanying drawings. A person with ordinary skill in the art and an understanding of the invention would readily appreciate that the invention successfully solves the above-mentioned problems in the prior art.

DESCRIPTION OF THE PREFERRED EMBODIMENTS

According to the method of the invention, micro-structures having a member or members prone to be bent, which have generally been formed on a substrate, are placed in a treating liquid by, e.g., immersing the substrate in the liquid, and are then removed together with the substrate from the liquid to an environment having a pressure less than the atmospheric pressure. The removal of the micro-structures can be carried out by, e.g., taking out the substrate from the liquid or drawing out the liquid from a container for the liquid, as discussed hereinafter in more detail.

Alternatively, the micro-structures on a substrate are first placed in a first treating liquid and then in a second treating liquid having a smaller surface tension than that of the first liquid, and thereafter removed from the second liquid. In this embodiment, the micro-structures may be removed from the second treating liquid to an environment at atmospheric pressure or a pressure less than atmospheric pressure. The second liquid should be compatible with the first liquid so as to effect the complete exchange of the liquids surrounding the micro-structures. When the first treating liquid is water or an aqueous solution, the second liquid can be exemplified by an organic solvent, such as a ketone, e.g., acetone, or an alcohol, e.g., ethanol, isopropyl alcohol, and isobutyl alcohol, and water containing a surfactant.

In the present invention, the term "removal" or "removing" involves the removal of micro-structure from an environment to another (e.g., from a liquid environment to a vacuum environment), and which is not necessarily accompanied by the spatial or locational movement of micro-structure itself. The removal of micro-structures, according to the invention, may advantageously be effected by the exchange of environments surrounding the micro-structure while keeping the micro-structure stationary. The exchange of environments can easily be carried out, e.g., by simple discharge of a liquid from a container thereof, or replacement of liquid in a container.

The micro-structures, after the removal from a treating liquid, may be dried. When the micro-structures are treated together with a substrate therefor by the treating liquid, the drying may be effected by heating one or both of the micro-structures and the substrate bearing the same. For the heating, a means can advantageously be used such as irradiation by laser light, infrared radiation, electron beam, or microwaves. Alternatively, the substrate may be heated by applying an ultrasonic wave having a frequency of preferably 1 GHz or more thereto.

It has been found that the drying of the micro-structures may also be effected by exposing the micro-structures, removed from a treating liquid, to a vapor of a liquid having a smaller surface tension than that of the treating liquid. In this alternative, the micro-structures removed from the treating liquid may be placed into a chamber, and the drying vapor can be externally supplied to the chamber, or be generated in the chamber, e.g., by heating the liquid. The liquid for providing the drying vapor should be compatible with the treating liquid. When the treating liquid is water or an aqueous solution, an organic solvent can be used such as an alcohol, e.g., ethanol, isopropyl alcohol, and isobutyl alcohol, or a ketone, e.g., acetone.

The treating liquid in which micro-structures are placed is believed to be responsible for the permanent deformation of the structural members of the micro-structures, after the liquid treatment, which are susceptible to an external force and liable to be bent or deformed. More specifically, the micro-structures, immediately after the removal from the treating liquid, are wetted by the liquid, and then spontaneously or forcedly dried. During the drying process, the liquid present between a structural member liable to be bent and another member or different rigid component will cause an external force to be applied to the member. This phenomenon will be described below in more detail.

Figure 4:
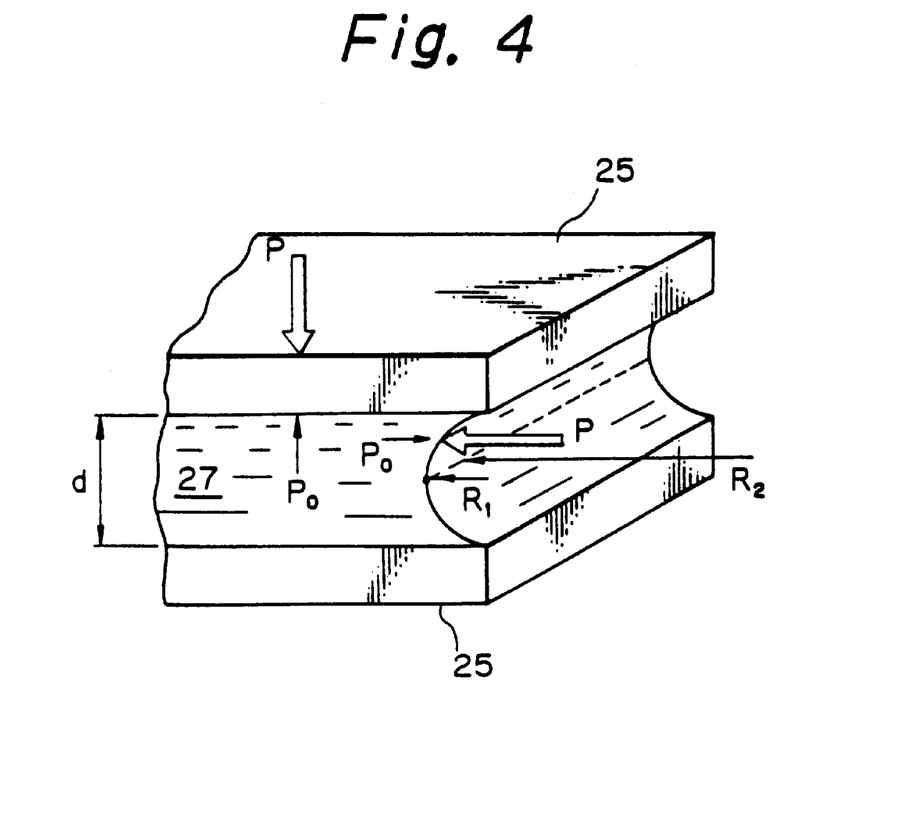
FIG. 4 is a model illustration for illustrating pressure acting on a fin due to surface tension of water which is present between the fin and another fin.

Referring to FIG. 4, there are shown at portions of respective free ends of two adjacent fins 25 included in a micro-structure. After the removal of the micro-structure from water as a treating fluid, there is water 27 between the two fins 25. In the course of drying, the surface of the water 27 present between the fins 25 is concave, as illustrated in FIG. 4. In this situation, considering the action of surface tension of water, the internal pressure $p_o$ of water 27 is smaller than the external pressure P. In terms of the fin-like member, one face is subjected to the external pressure P, while the other face is subjected to a pressure equal to the internal pressure $p_o$ of the water, since it is contact with the water 27. The deformation of fins occurring in the course of drying may be explained by an idea that the deformation results from the difference between the external pressure P applied to one side of each fin and the internal pressure $p_o$ in the other side thereof.

The pressure difference (ΔP) between the external pressure applied to the fin-like member and the internal pressure of water is calculated using the following Laplace's equation:

$$\Delta P = \gamma \left( \frac{1}{R_1} + \frac{1}{R_2} \right) \quad (1)$$

wherein γ is the surface tension of a fluid; and $R_1$ and $R_2$ are primary radii of curvature. Provided that the treating liquid is water having a surface tension of 73 dyn/cm, $R_1 = -2.5 \times 10^{-6}$ cm (contact angle=0°; distance d between fins=$5 \times 10^{-6}$ cm), and $R_2 = -\infty$, the pressure difference ΔP is calculated to be approximately 30 atmospheres.

The pressure difference resulting from the surface tension of water can thus reach 30 atmospheres on calculation. However, even if the external pressure is a maximum of 1 atmosphere, as is in the prior art, the internal pressure of water never becomes negative. In the case of a substantially large pressure difference, the internal pressure of water is thus regarded as nearly zero, and only the external pressure applied to the fin side which is out of contact with water can be considered to have an effect on the fin. Thus, the pressure applied to the fin can be reduced, and the fin may be prevented from bending, if the external pressure is reduced. In this way, the method of the present invention, in which the micro-structures are removed from a treating liquid to an environment of a pressure less than the atmospheric pressure, allows the reduction of the external pressure applied to the structural members, to thereby inhibit the permanent deformation of members.

As can be seen from the above equation (1), the pressure applied to the fin may also be reduced, if the surface tension of fluid remaining between the adjacent fins is lowered. Thus, the inventive method, in which the micro-structures are placed in a first treating liquid having a larger surface tension and then in a second liquid having a smaller surface tension, also allows the reduction of the external pressure, to thereby prevent the permanent deformation of structural members of the micro-structures. The displacement of the micro-structures to be treated from the first fluid to the second one is not necessarily carried out by moving the micro-structures from one container of the first fluid to the other container of the second fluid. In the present invention, it is advantageous to exchange the first liquid with the second liquid in the same container in which the micro-structures are placed, so as to be immersed in the content fluid. The first and second treating liquids should be compatible with each other in order to allow the easy replacement of the liquids between the adjacent members (or between a member and a different rigid component).

For example, when water is used as the first fluid, the second fluid may be acetone, ethanol, isobutyl alcohol, or a surfactant-containing water. In this case, the second fluid has a surface tension of about 20 dyn/cm, equivalent to a quarter of the surface tension of water. Accordingly, the pressure difference ΔP between the external pressure and the internal pressure of water may be expected to be below 1 atmosphere, according to conditions of wetting and drying of the fins, and the pressure applied to the fins may thus be reduced. In the case of the treatment of micro-structures for semiconductor devices, since the substrate on which micro-structures have been formed would often be subjected to a subsequent process such as deposition thereon of an insulator film, the amount of impurities, such as alkali metals and heavy metals, contained in the second liquid would be controlled so as to be 10 ppb or less.

Using fluids which are different in surface tension, since a reduced ΔP can be expected as described above, an environment to which micro-structures are removed from the second liquid may have the atmospheric pressure or a pressure less than the atmospheric pressure.

The inventors have further found that it is similarly effective, in preventing permanent deformation of structural members of micro-structures after the removal from a treating liquid, to dry the micro-structures removed from the treating liquid by exposing the micro-structures to a vapor of a liquid having a smaller surface tension than that of the treating liquid. In this case, it is believed that the treating liquid, e.g., water, remaining between the structural members is gradually replaced by the vapor of the other liquid of lower surface tension, the and the surface tension of remaining liquid itself is consequently reduced, to thereby result in the reduction in the difference between an external pressure and an internal pressure of the treating liquid.

In the model depicted in FIG. 4, it is postulated that the surface of the liquid interposed between the fins is concave and stable. When an appropriate energy is externally supplied to the liquid surface to put it into disorder, a greatly reduced pressure difference between the external pressure and the internal pressure of water may be contemplated.

Techniques for putting a liquid surface into disorder include irradiating the micro-structures or a supporting substrate therefor with an energy beam of high intensity to thereby rapidly heat the same. The water between members such as fins is rapidly evaporated by the heating, and the pressure created during the evaporation causes the liquid surface to tremble, to thereby prevent the formation of a stable concave. As energy sources, laser light, infrared radiation, electron beam, microwave and the like may be used.

Another way of supplying energy to put a liquid surface into disorder is to apply an ultrasonic wave to the supporting substrate for micro-structures. It is advantageous to use an ultrasonic wave having a sufficiently high frequency. In general, it is preferable to use an ultrasonic wave having a frequency of 1 GHz or more. More particularly, ultrasonic waves having a wavelength of up to about ten times the distance between fins may be expected to have an effect. By way of example, for the distance between fins of $5 \times 10^{-6}$ centimeters, a preferred frequency of ultrasonic wave is 3 GHz or more.

The externally supplied energy thus allows the micro-structures to be dried, preventing the structural members of the micro-structures from being permanently deformed. Therefore, the external energy supply may be employed for drying the micro-structures removed from a treating liquid to the atmosphere, as well as for drying the micro-structures removed to an environment having a pressure less than the atmospheric pressure and those removed from a second treating liquid having a lower surface tension.

Although the mechanism of permanent deformation of structural members liable to be bent in micro-structures has not been fully known, the permanent deformation may be believed to result from the contact of a member, such as a fin, with another member (or other rigid component), and the accompanying bonding of the members in the contact area, which might be caused by an attraction force on an atomic or molecular level. Thus, even though the member is bent by the pressure applied thereto after the removal from a treating liquid, the member can return to the former condition, i.e., the condition of no contact of the member with another member, after the disappearance of the pressure which caused the bend of the member, when the member does not come into contact with another member before the disappearance of the pressure applied thereto.

The structural members which are supported at one end and free at the other end are evidently much more susceptible to permanent deformation than those supported at both ends. In the case of structural members supported at only one end, such as fins, it is possible to avoid permanent deformation due to the contact of the free end thereof with another free end of a second member or a rigid component such as a substrate for supporting the micro-structures including the members, when the members or fins have appropriate thickness and length from the supported end to the free end, as discussed in the following sections.

Figure 5A:
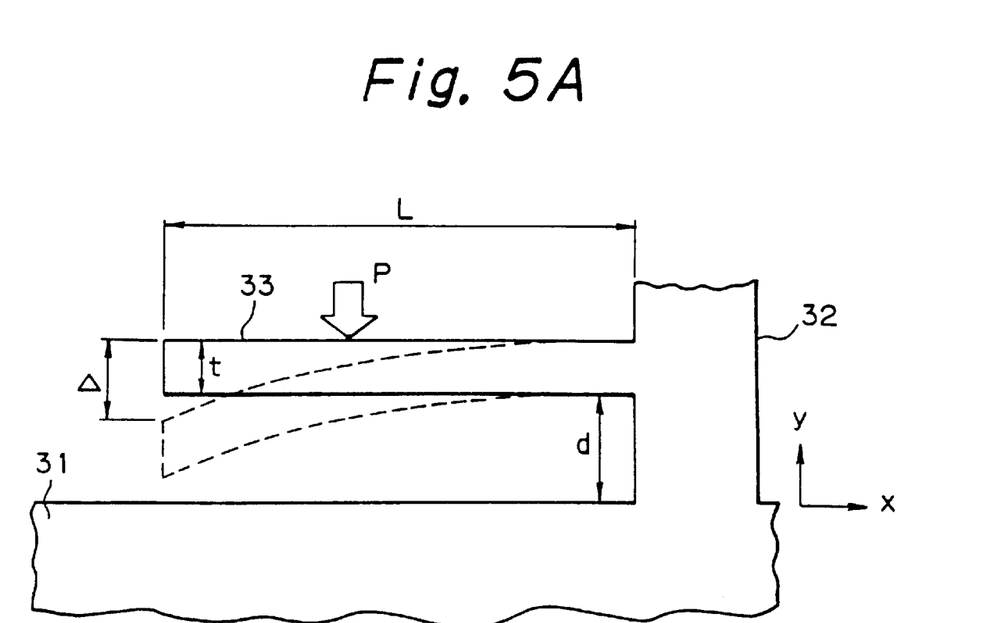
FIGS. 5A and 5B are illustrations of members to be bent by the effect of pressure applied thereto.

Referring to FIG. 5A, there is shown a fin 33 before bending by the solid line, which is supported at one end by a supporting member 32, and which in turn is supported by a substrate 31. The broken line in this drawing indicates the bent fin. In this situation, the substrate 31 as well as the supporting member 32 are regarded as rigid bodies, and are therefore not deformable. The bend Δ of the fin at the free end, being to which is applied a pressure P, is determined by the following equation (It should be noted that the width of the fin is assumed hereinafter to be 1 centimeter of unit length for simplification, and thus is not included in the equations presented below.):

$$\Delta = PL^4/8EI$$
$$= 3PL^4/2Et^3$$

wherein  $P$ is a pressure applied to the fins;

$L$ is a length of the fin;

$t$ is a thickness of the fin;

$E$ is a Young's modulus of the material of fin;

and $I$ is a moment of inertia of the cross section, represented by the following equation:

$$I = \int_{-t/2}^{t/2} y^2 dy$$
$$= t^3/12$$

In this case, since the bend Δ of fin 33 is not related directly to the width of the fin, the condition for the fin 33 not to come into contact with the substrate 31 is that the bend is smaller than the distance d between the fin and the substrate, i.e., Δ<d. Converting this relationship to an equation for L, the following is obtained:

$$L < (2Edt^3/3P)^{1/4} \quad (2)$$

Figure 5B:
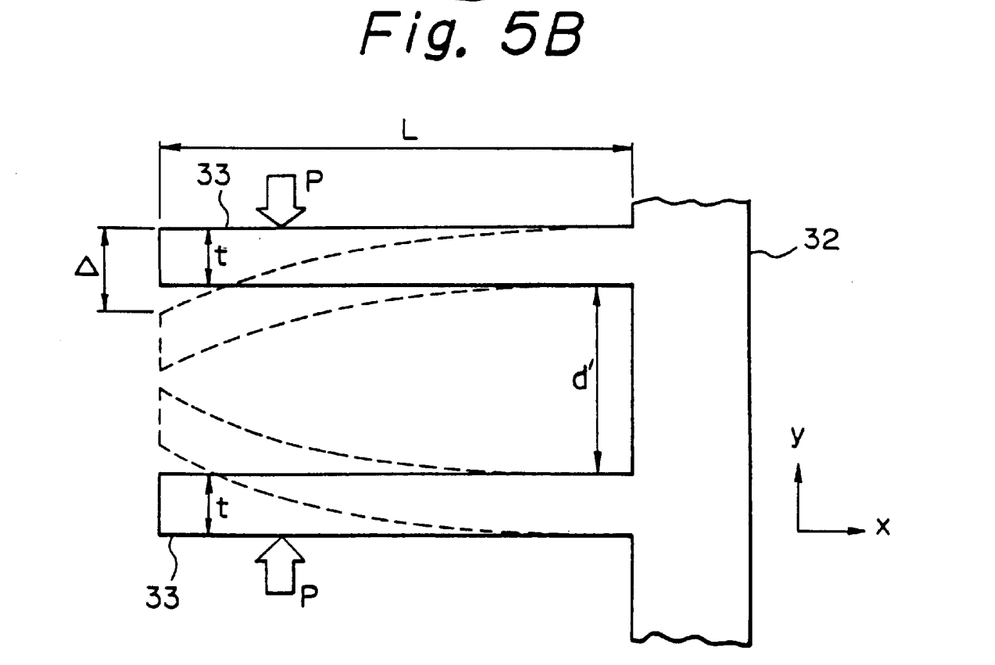

When there are adjacent fins, as shown in FIG. 5B, these fins can be bent toward the opposed ones. Thus, the allowable bend in this case is half of the distance d' between the fins, and the following equation is obtained:

$$L < (Ed't^3/3P)^{1/4} \quad (3)$$

The members designed so as to meet the relationship represented by equation (2) or (3) are free from permanent deformation, because a member does not come into contact with an adjacent member or substrate even if the members suffer an external pressure.

Equation (3) may approximately be applied to adjacent members made of different materials and different in Young's modulus, unless the members exhibit excessively different modulus values.

To facilitate appreciation and understanding of the invention, the following examples are presented. The invention, however, is not limited to these examples.

EXAMPLE 1

Micro-structures including fin-like members were formed on a supporting substrate of silicon. The micro-structures were made of polysilicon.

The procedure described hereinbefore in reference to FIGS. 2A to 2C was employed. (It should be noted that the ratios of thickness of various layers or films, as well as the dimensions of the micro-structure in these drawings, are not to scale for convenience.)

First, a first insulator film 11 of $SiO_2$ as a spacer, a conductor film 12 of polysilicon for the fin material, and a second insulator film 11' of $SiO_2$ were sequentially deposited on a silicon substrate 10 by CVD (FIG. 2A). The thickness of each film was 500 angstroms. Holes, each having a diameter of 0.5 micrometers, were then made in the laminated films so as to expose the surface of the substrate of silicon at the bottoms thereof, after which a polysilicon film 13 was deposited in a thickness of 500 angstroms (FIG. 2B). Subsequently, the laminated films were etched so as to leave three types of sections around the holes for later providing fins of 0.7, 1.2, and 2.0 micrometers length (FIG. 2C). The remaining spacer insulator films 11, 11' were then etched out by a diluted solution of hydrofluoric acid, to thereby form micro-structures having fin-like members. The substrate bearing the formed micro-structures was removed out of the etching bath, and was moved into a container containing water for washing.

Subsequently, the substrate was pulled out of the water container to allow the micro-structures to be dried in the air. After the drying, the treated fins were inspected by microscopy. The results are shown in Table 1, as percent of deformed or bent fins.

TABLE 1

| Fin length (μm) | Percent of bent fins (%) |
|---|---|
| 0.7 | 0 |
| 1.2 | 43 |
| 2.0 | 100 |

The micro-structures in this example have two adjacent fin members, and both fins have a potentiality of being bent. Accordingly, the boundary value of fin length, which represents the length possibly leading to permanent deformation of a fin if the fin length is beyond the same, is calculated by equation (3) to be 1.37 micrometers, under the condition of an external pressure of 1 atmosphere. As can be seen in Table 1, fins having a length of 0.7 microns (much shorter than that boundary value) resulted in no deformation, and fins having a length of 1.2 microns, and thus slightly shorter than the boundary value, involved 43 percent deformation. In contrast, all fins having a length of 2.0 microns (longer than the boundary value) were permanently deformed. Thus, for the water treated fins to be free from permanent deformation, it was revealed that selection of a structural parameter at least meeting equation (3) is required. This confirms the validity of equation (3).

EXAMPLE 2

Figure 6:
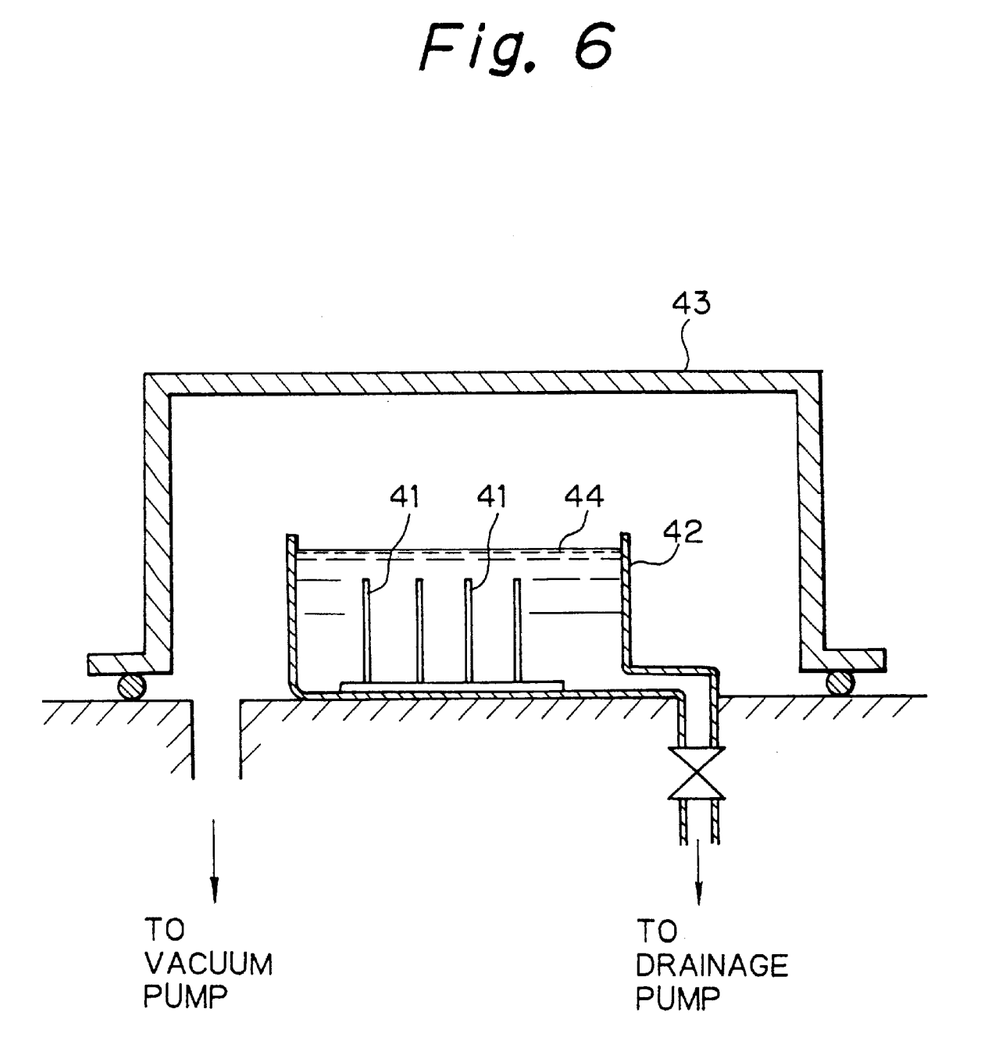
FIG. 6 is a schematic view illustrating the process in vacuum used in Example 2.

Using the procedure as described in Example 1, similar micro-structures were formed on several substrates of silicon. As shown in FIG. 6, after etching, the substrates 41 on which three types of micro-structures as those in Example 1 had been formed were placed in a water container 42, which in turn was put in a vacuum chamber 43. The chamber 43 was then evacuated by a vacuum pump (not shown) to reduce the pressure therein to 0.3 atmospheres. Subsequently, the water 44 in the container 42 was discharged using a drainage pump (not shown) to allow the micro-structures to be dried, while the vacuum condition was maintained. After the drying, the fin members of the micro-structures were examined by microscopy. The results are shown in Table 2.

TABLE 2

| Fin length (μm) | Percent of bent fins (%) |
|---|---|
| 0.7 | 0 |
| 1.2 | 0 |
| 2.0 | 100 |

In this case, the boundary value of fin length is calculated to be 1.81 micrometers by equation (3) for the external pressure of 0.3 atmospheres. This agrees with the fact that an improved percentage of bent fins (0%) was obtained for the fins having a length of 1.2 micrometers, whereas 100% of fins having a length of 2.0 micrometers were permanently deformed, as before.

EXAMPLE 3

Using the procedure as described in Example 1, three similar types of micro-structures were formed on silicon substrates. After etching, the substrates were placed in a water container and were then moved into an acetone container. One hour after, the substrates were removed from the acetone container to allow drying. The fin members of the dried micro-structure were then examined by microscopy. The obtained results are shown in Table 3.

TABLE 3

| Fin length (μm) | Percent of bent fins (%) |
|---|---|
| 0.7 | 0 |
| 1.2 | about 30 |
| 2.0 | 100 |

It is apparent that the use of acetone having a lower surface tension as a second liquid significantly lowered percentage of bent fins of 1.2 micrometer fin length, compared with the results in Example 1.

EXAMPLE 4

Using the procedure as described in Example 1, three similar types of micro-structures were formed on substrates. After etching, the substrates were placed in a water container for washing. Subsequently, the substrates were taken out from the container, and immediately irradiated with a pulse laser light (wavelength=6900 angstroms), so as to be provided with an energy of 0.5 joules/pulse for an area of 2×2 cm only one time. The fin members of the micro-structures in the irradiated area were then examined by microscopy.

The results are shown in Table 4.

TABLE 4

| Fin length (μm) | Percent of bent fins (%) |
|---|---|
| 0.7 | 0 |
| 1.2 | 8 |
| 2.0 | 100 |

It is apparent that the rapid evaporation of water on the substrate by the irradiation of laser light evidently lowered percent of bent fins at 1.2 micrometer fin length compared with the results in Example 1.

EXAMPLE 5

This example specifically illustrates the production of a fin-type stack capacitor in a DRAM cell. In this example, the capacitors were made using the method according to the present invention, in which micro-structures removed from a treating liquid are dried by exposing the micro-structures to a vapor of a liquid having a smaller surface tension than that of the treating liquid.

Figure 7A:
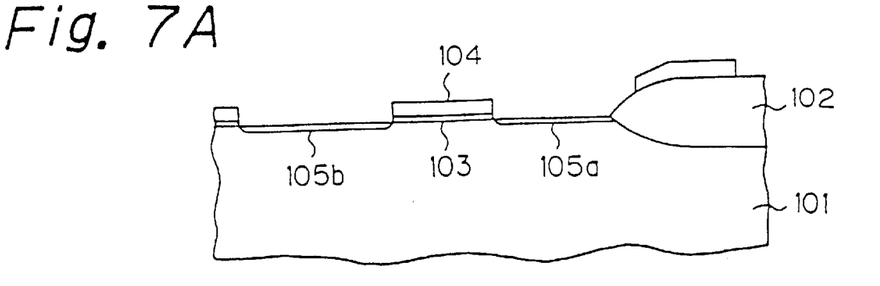
FIGS. 7A to 7G show a process for the production of capacitors used for semiconductor devices described in Example 5.

As shown in FIG. 7A, field oxide films 102 consisting of $SiO_2$ and having a thickness of 2500 angstroms for separating elements were formed on a silicon substrate 101. A gate oxide film 103 having a thickness of 100 angstroms was then formed on the substrate 101 at a given area of each element region between the field oxide films 102, and on this gate oxide film 103, a gate electrode 104 of polysilicon having a thickness of 1000 angstroms was formed. Subsequently, impurity-diffused regions 105a and 105b for source and drain regions were formed in the substrate 101 between the gate electrode 104 and the field oxidized film 102. (The gate electrode 104 also forms a word line in a memory cell array.)

Figure 7B:
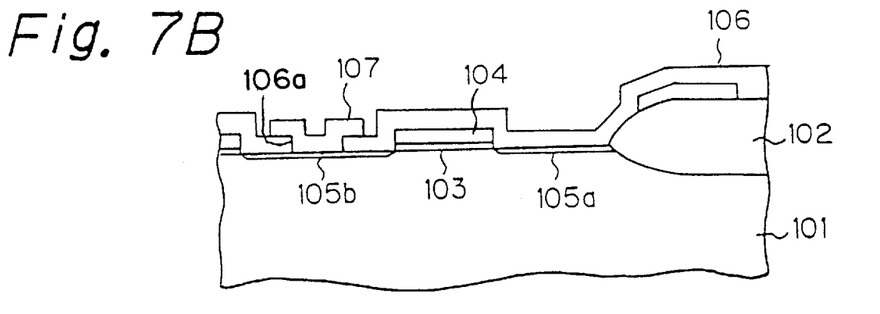

An interlayer insulation film 106 having a thickness of 500 angstroms was then formed to totally cover the different films and regions on the substrate as described above. The formed insulation film 106 was etched to make contact holes 106a at the bottoms of which the drain regions 105b were exposed. Bit lines 107 of polysilicon were then formed so as to come into contact with the exposed drain regions 105b, as shown in FIG. 7B.

Figure 7C:
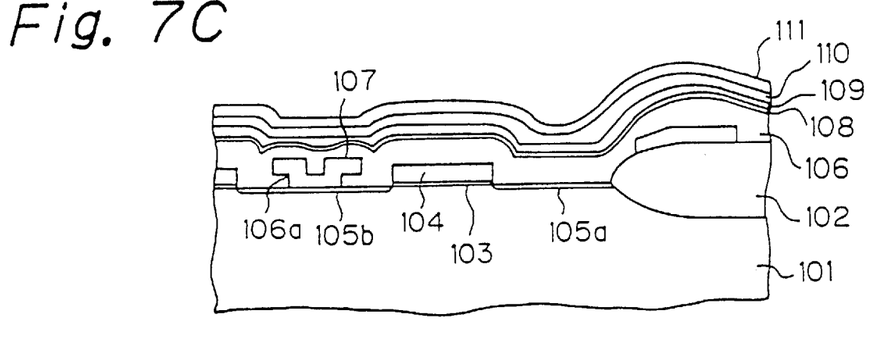

Subsequently, as shown in FIG. 7C, a nitride film 108 (300 angstroms in thickness), an oxide film 109 of $SiO_2$ (500 angstroms), a silicon film 110 of polysilicon (amorphous silicon may also be used) (500 angstroms), and an oxide film 111 of $SiO_2$ (500 angstroms) were sequentially deposited by CVD. (The silicon film 110 later forms a lower electrode of each fin-type capacitor.)

Figure 7D:
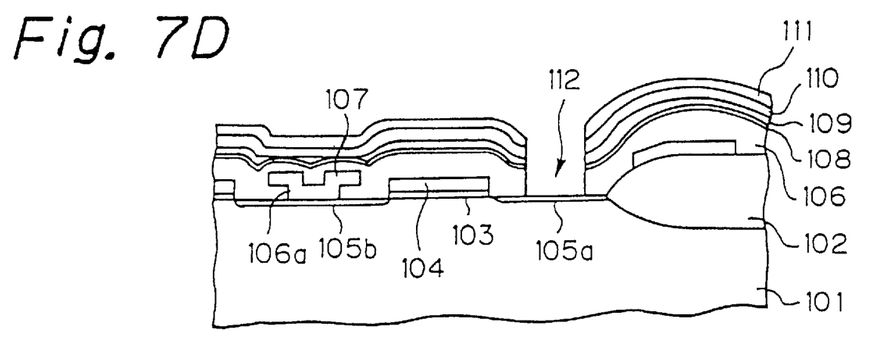

To make contact holes 112 for effecting the contact of capacitor electrodes with the source regions 105a, the oxide film 111, silicon film 110, oxide film 109, nitride film 108, and interlayer insulation film 106 were etched, to expose the source regions 105a, as shown in FIG. 7D.

Figure 7E:
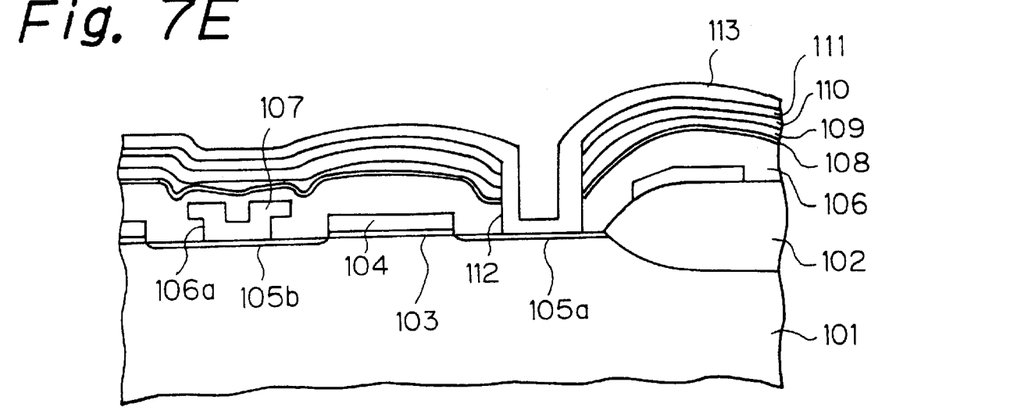

Polysilicon was then deposited by CVD to make a silicon film 113 having a thickness of 500 angstroms, as shown in FIG. 7E, so as to come into contact with the source regions 105 exposed at the bottoms of the contact holes 112 and the silicon film 110 for the lower electrodes of capacitors exposed at the walls of the contact holes 112. Amorphous silicon may be used for the silicon film 113. This silicon film 113 later forms the upper electrodes of each fin-type capacitor.

Figure 7F:
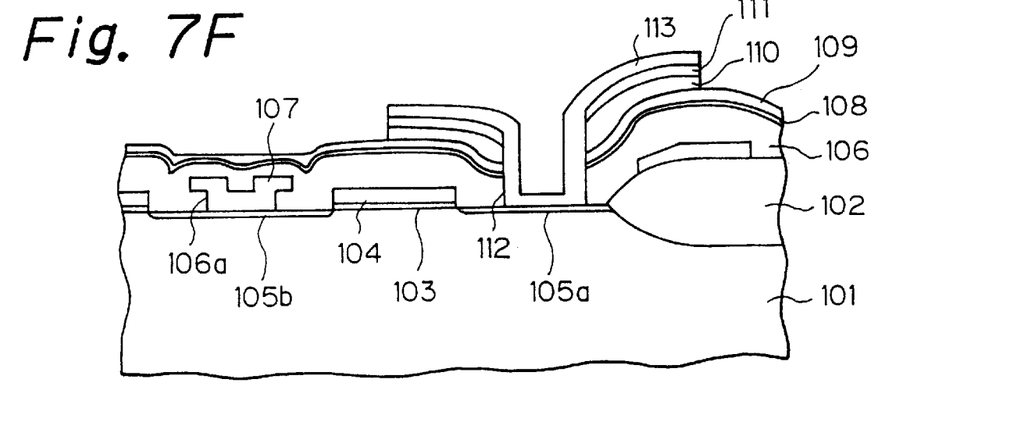

Subsequently, the silicon film 113, oxide film 111, and silicon film 110 were sequentially patterned by etching for producing desired capacitors, as indicated in FIG. 7F.

Figure 7G:
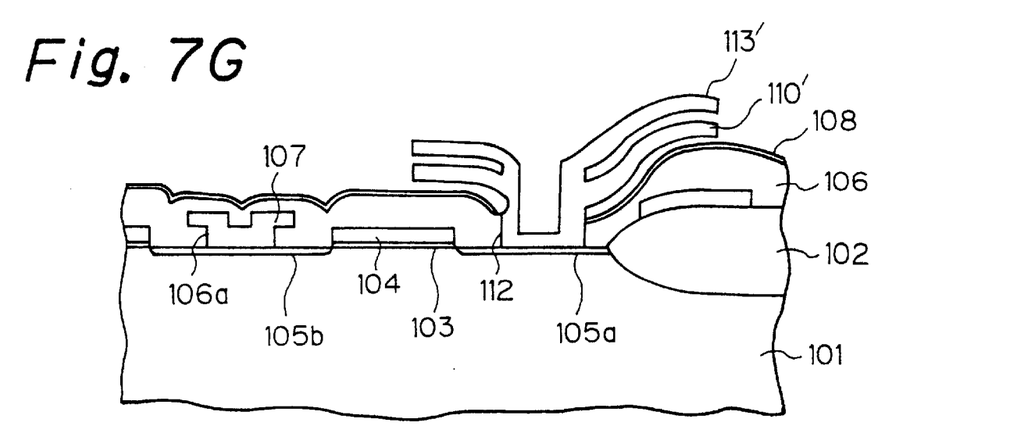

Using hydrofluoric acid, the remaining oxide film 111 between the silicon films 110 and 113, which later formed capacitor electrodes, and the remaining oxide film 109 on the nitride film 108, which later served as an etching stopper, were removed, as shown in FIG. 7G. On this process, two fins of silicon 110' and 113' were created which form electrodes of a capacitor of fin-type micro-structure. These fins 110' and 113' were then washed with pure water to remove a residue of SiF present on the surfaces of the fins 110', 113' after the removal of the oxide films 109, 111, as a result of the treatment by hydrofluoric acid, since the residue of SiF would cause deterioration in the characteristics of the insulator films of the capacitors. During the washing, water, which may contain fluorine in some cases, penetrates into the spaces between the fins 110', 113', and can cause permanent deformation of the fins as mentioned hereinbefore. To prevent the deformation of the fins, the wetted substrate was then moved into a chamber (not shown), into which vapor of isopropyl alcohol (temperature=83° C.) was externally supplied, to thereby effect the removal of the residual water and drying of the formed capacitors.

By microscopy, it was found that the resultant fins, which had a length of 1.1 micrometers, were free from permanent deformation. In contrast, some of the fins having a similar length, but made by drying the same in the atmosphere, suffered permanent deformation.

For completion of DRAM semiconductor devices provided with a fin-type capacitor, an insulator film and opposed electrodes would additionally be formed through a conventional process, to complete the capacitors, and further, an interlayer insulation film and a conductor layer thereon would be formed.

As can be seen from the foregoing, the present invention allows liquid treatment of micro-structures comprising at least a structural member liable to be bent, without allowing the member to permanently be deformed. Although the invention is mainly described herein by the illustration of fin-like member such as commonly found in a capacitor of a dram semiconductor device, it would be obvious that the invention may equivalently be applied to other microstructures, such as those called micromachines and resonant sensors referred to hereinbefore, which are produced by a production process similar to that employed for the production of semiconductor devices.

What is claimed is:

1. Method of liquid treatment, comprising the steps of:
   immersing a microstructure, including a plurality of bendable elongated structural members with a space between each member, in a treating liquid in a first environment having a first ambient atmospheric pressure; and
   removing said microstructure from said treating liquid to a second environment, the second environment having a second ambient atmospheric pressure which is less than said first ambient atmospheric pressure, such that said space is maintained and thereby bending of said structural members is prevented, when said microstructure is removed from said treating liquid to said second environment.

2. The method according to claim 1, wherein the immersing step is carried out in a container for the treating liquid.

3. The method according to claim 1, further comprising, prior to the immersing and removing steps, the steps of:
   forming the microstructure on a substrate together with other microstructures to form a plurality of microstructures; and
   simultaneously treating the plurality of microstructures.

4. The method according to claim 1, wherein the microstructure removed from the treating liquid is spontaneously dried.

5. The method according to claim 1, wherein the microstructure removed from the treating liquid is forcedly dried.

6. The method according to claim 5, wherein the microstructure is dried by using one of laser light, infrared radiation, electron beam, microwave, and ultrasonic wave.

7. The method according to claim 3, wherein the plurality of microstructures is dried by heating at least one of the plurality of microstructures and the substrate with one of laser light, infrared radiation, electron beam, and microwave.

8. The method according to claim 3, wherein the plurality of microstructures is dried by heating with an ultrasonic wave applied to the substrate.

9. A method of liquid treatment of a microstructure including a plurality of bendable elongated structural members with a space between each member, the liquid treatment of the microstructure requiring immersing the microstructure in a treating liquid in a first ambient environment and removing the microstructure from the treating liquid and from the first ambient environment, thereby producing forces sufficient to deform at least one of the structural members, the method comprising the step of:
   placing the microstructure in the first treating liquid for performing the liquid treatment to completion; and
   upon completion of the liquid treatment, removing the microstructure from the first treating liquid and, substantially simultaneously, subjecting the microstructure to a further step which counters the forces otherwise sufficient to deform at least one of the structural members.

10. A method of liquid treatment of a microstructure including a plurality of elongated bendable structural members in spaced relationship, with respect to the rigid member, wherein the microstructure, when placed in a treating liquid within an ambient environment for performing the liquid treatment, and subsequently removed from the treating liquid to another ambient environment, at least one of the plurality of structural members is subject to deformation, reducing the spaced relationship, the method comprising the steps of:
   placing the microstructure in the treating liquid as a first ambient environment for performing the liquid treatment; and subsequent to completion of the liquid treatment of the microstructure, removing the microstructure from the treating liquid to a second ambient environment different from the first ambient environment, the second ambient environment being selected so as to minimize the deformation of the at least one structural member and thereby to maintain the spaced relationship;

wherein said first ambient environment includes a first ambient atmospheric pressure and the second ambient environment includes a second, relatively lower, ambient atmospheric pressure.

11. The method as recited in claim 10, wherein the first ambient environment includes the first treating liquid having a first surface tension and the second ambient environment includes a second treating liquid having a second surface tension smaller than the first surface tension.

12. The method as recited in claim 10, wherein the first ambient environment is defined by a first surface tension of the first treating liquid and the second ambient environment is defined by a second lower surface tension of a second, different liquid.

13. The method as recited in claim 10, wherein the first ambient environment is defined by placing the microstructure in the treating liquid, and the second ambient environment includes a drying ambient environment produced by one of a laser light, an infrared radiation, an electron beam, a microwave radiation, and an ultrasonic wave.

14. A method for liquid treating a microstructure including a plurality of bendable elongated spaced structural members, the method comprising the steps of:

placing the microstructure in a first treating liquid;

subsequently removing the microstructure from the first treating liquid;

placing the microstructure in a second treating liquid having a smaller surface tension than the first treating liquid; and subsequently removing the microstructure from the second treating liquid, thereby substantially preventing bending of at least one of the members.

15. The method according to claim 14, wherein the first treating liquid is one of water and an aqueous solution, and the second treating liquid is an organic solvent compatible with one of water and water containing a surfactant.

16. The method according to claim 15, wherein the organic solvent is one of alcohols and ketones.

17. The method according to claim 14, wherein the placing steps comprise the steps of immersing the microstructure in the first and second liquids, each within a container.

18. The method according to claim 14, wherein the microstructure removed from the second treating liquid is spontaneously dried.

19. The method according to claim 14, wherein the microstructure removed from the second treating liquid is forcedly dried.

20. The method according to claim 19, wherein the microstructure removed from the second treating liquid is dried using one of laser light, infrared radiation, electron beam, microwave, and ultrasonic wave.

21. The method according to claim 14, further comprising the step of, prior to the placing and removing steps, forming a plurality of the microstructures on a substrate, and simultaneously treating the plurality of microstructures.

22. The method according to claim 21, further comprising the steps of:

drying the plurality of microstructures by heating at least one of the plurality of microstructures and the substrate with one of laser light, infrared radiation, electron beam, and microwave.

23. The method according to claim 21, further comprising the step of:

drying the plurality of microstructures by heating with an ultrasonic wave applied to the substrate.

24. A method of liquid treatment of a microstructure including a plurality of spaced bendable members, the method comprising the steps of:

placing the microstructure in a treating liquid;

removing the microstructure from the treating liquid; and drying the microstructure by exposure to vapor of a second liquid having a smaller surface tension than the treating liquid, thereby substantially preventing bending of at least one of the members.

25. The method according to claim 24, wherein the treating liquid is one of water and an aqueous solution, and the second liquid is an organic solvent compatible with water.

26. The method according to claim 25, wherein the organic solvent is one of alcohols and ketones.

27. A method of liquid treatment of a microstructure including a plurality of spaced bendable members, the method comprising the steps of:

placing the microstructure in a treating liquid;

removing the microstructure from the treating liquid to the atmosphere; and drying the microstructure using one of laser light, infrared radiation, electron beam, microwave, and ultrasonic wave, thereby substantially preventing bending of at least one of the members.

28. The method according to claim 27, further comprising the step of:

forming the microstructure on a substrate together with other microstructures to form a plurality of microstructures on the substrate, wherein the plurality of microstructures is simultaneously treated.

29. The method according to claim 28, wherein the plurality of microstructures is dried by heating at least one of the microstructures and the substrate with one of laser light, infrared radiation, electron beam, and microwave.

30. The method according to claim 28, wherein the microstructures are dried by heating with an ultrasonic wave applied to the substrate.

* * * * *